United States Patent
Kotani et al.

(10) Patent No.: US 11,004,177 B2
(45) Date of Patent: May 11, 2021

(54) IMAGE PROCESSING DEVICE AND BOARD PRODUCTION SYSTEM

(71) Applicant: FUJI CORPORATION, Chiryu (JP)

(72) Inventors: Kazuya Kotani, Toyota (JP); Shuichiro Kito, Toyota (JP)

(73) Assignee: FUJI CORPORATION, Chiryu (JP)

( * ) Notice: Subject to any disclaimer, the term of this patent is extended or adjusted under 35 U.S.C. 154(b) by 44 days.

(21) Appl. No.: 15/125,221

(22) PCT Filed: Mar. 13, 2014

(86) PCT No.: PCT/JP2014/056694
§ 371 (c)(1),
(2) Date: Sep. 12, 2016

(87) PCT Pub. No.: WO2015/136669
PCT Pub. Date: Sep. 17, 2015

(65) Prior Publication Data
US 2017/0069057 A1    Mar. 9, 2017

(51) Int. Cl.
*G06T 3/40* (2006.01)
*H04N 1/195* (2006.01)
(Continued)

(52) U.S. Cl.
CPC .......... *G06T 3/4053* (2013.01); *G06T 7/0004* (2013.01); *H04N 1/19594* (2013.01);
(Continued)

(58) Field of Classification Search
CPC ................ G06T 3/4053; G06T 7/0004; G06T 2207/10004; G06T 2207/20008; G06T 2207/30141; H04N 1/19594; H05K 13/08
(Continued)

(56) References Cited

U.S. PATENT DOCUMENTS

| | | | | |
|---|---|---|---|---|
| 2002/0194729 A1* | 12/2002 | Kuribayashi | ...... | H05K 13/0465 29/834 |
| 2004/0012676 A1* | 1/2004 | Weiner | ................ | G01N 21/253 348/207.1 |

(Continued)

FOREIGN PATENT DOCUMENTS

| | | |
|---|---|---|
| CN | 101477066 A | 7/2009 |
| EP | 2 120 444 A1 | 11/2009 |

(Continued)

OTHER PUBLICATIONS

International Search Report dated Apr. 15, 2014 in PCT/JP2014/056694 filed Mar. 13, 2014.
(Continued)

*Primary Examiner* — Joseph G Ustaris
*Assistant Examiner* — Matthew David Kim
(74) *Attorney, Agent, or Firm* — Oblon, McClelland, Maier & Neustadt, L.L.P.

(57) ABSTRACT

An image processing device capable of reducing the load of image processing while shortening the time required for the image processing which uses super-resolution processing. The image processing device includes a process determination section which determines an execution necessity of the super-resolution processing in relation to image data during execution of a production process for every type of target object, a super-resolution processing section which executes the super-resolution processing which uses a plurality of items of the image data according to determination results of the process determination section to generate high resolution data, and a state recognition section which recognizes a state of the target object based on, of the image data and the high resolution data, the one corresponding to the determination results of the process determination section.

8 Claims, 6 Drawing Sheets

[RESULT OF SUITABILITY DETERMINATION]

| TYPE OF ELECTRONIC COMPONENT | HIGH RESOLUTION DATA | LOW RESOLUTION DATA |
|---|---|---|
| A | (SUITABLE) | IMPOSSIBLE |
| B | (SUITABLE) | INSUFFICIENT |
| C | (SUITABLE) | SUITABLE |
| : | : | : |

[PROCESS MANAGEMENT DATA M3]

| TYPE OF ELECTRONIC COMPONENT | NECESSITY OF SUPER-RESOLUTION PROCESSING |
|---|---|
| A | NECESSARY |
| B | NECESSARY |
| C | UNNECESSARY |
| : | : |

(51) Int. Cl.
H05K 13/08 (2006.01)
G06T 7/00 (2017.01)

(52) U.S. Cl.
CPC .. *H05K 13/081* (2018.08); *G06T 2207/10004* (2013.01); *G06T 2207/20008* (2013.01); *G06T 2207/30141* (2013.01)

(58) Field of Classification Search
USPC .......................................................... 348/87
See application file for complete search history.

(56) References Cited

U.S. PATENT DOCUMENTS

| | | | | |
|---|---|---|---|---|
| 2005/0129301 | A1* | 6/2005 | Kanno | G01R 31/01 382/145 |
| 2008/0154392 | A1* | 6/2008 | Maenishi | H05K 13/0853 700/32 |
| 2009/0161169 | A1* | 6/2009 | Muramatsu | H04N 1/40068 358/447 |
| 2009/0284800 | A1 | 11/2009 | Misawa | |
| 2010/0008580 | A1* | 1/2010 | Mizuno | H04N 1/40068 382/176 |
| 2010/0026685 | A1* | 2/2010 | Terada | G06T 3/4053 345/428 |
| 2010/0053694 | A1* | 3/2010 | Tsuchida | G06T 3/4053 358/447 |
| 2010/0141823 | A1* | 6/2010 | Tsunekawa | G06T 3/4053 348/333.12 |
| 2010/0229377 | A1* | 9/2010 | Jindo | H05K 13/0812 29/709 |
| 2010/0231733 | A1* | 9/2010 | Dobashi | G06K 9/00463 348/208.4 |
| 2011/0007823 | A1* | 1/2011 | Matsuo | G06K 9/00369 375/240.26 |
| 2012/0004759 | A1* | 1/2012 | Ishimoto | H05K 13/0815 700/117 |
| 2012/0051667 | A1* | 3/2012 | Kang | G06T 3/4053 382/299 |
| 2013/0010100 | A1* | 1/2013 | Kotaki | G01B 15/04 348/80 |
| 2014/0072232 | A1* | 3/2014 | Zheng | G06T 3/4053 382/199 |
| 2015/0066200 | A1* | 3/2015 | McCarthy | B07C 5/3422 700/223 |
| 2015/0359149 | A1* | 12/2015 | Itoh | H05K 13/08 29/834 |

FOREIGN PATENT DOCUMENTS

| | | |
|---|---|---|
| JP | 11-191157 A | 7/1999 |
| JP | 2005-127836 A | 5/2005 |
| JP | 2006-287116 A | 10/2006 |
| JP | 2007-248145 A | 9/2007 |
| JP | 4550644 B2 | 7/2010 |
| JP | 2011-155050 A | 8/2011 |
| JP | 2013-26278 A | 2/2013 |

OTHER PUBLICATIONS

Extended European Search Report dated Feb. 21, 2017 in Patent Application No. 14885828.5.
Office Action dated Nov. 28, 2017 in Japanese Patent Application No. 2016-507205.
Office Action dated Jul. 16, 2018 in Chinese Patent Application No. 201480077045.7, (submitting English translation only), 5 pages.

* cited by examiner

[RESULT OF SUITABILITY DETERMINATION]

| TYPE OF ELECTRONIC COMPONENT | HIGH RESOLUTION DATA | LOW RESOLUTION DATA |
|---|---|---|
| A | (SUITABLE) | IMPOSSIBLE |
| B | (SUITABLE) | INSUFFICIENT |
| C | (SUITABLE) | SUITABLE |
| ⋮ | ⋮ | ⋮ |

[PROCESS MANAGEMENT DATA M3]

| TYPE OF ELECTRONIC COMPONENT | NECESSITY OF SUPER-RESOLUTION PROCESSING |
|---|---|
| A | NECESSARY |
| B | NECESSARY |
| C | UNNECESSARY |
| ⋮ | ⋮ |

[PROCESS MANAGEMENT DATA M3]

| TYPE OF ELECTRONIC COMPONENT | PROCESSING LEVEL OF SUPER-RESOLUTION PROCESSING |
|---|---|
| A | 4 FRAMES (PROCESSING NECESSARY) |
| B | 2 FRAMES (PROCESSING NECESSARY) |
| C | 1 FRAME (PROCESSING UNNECESSARY) |
| ⋮ | ⋮ |

IMAGE PROCESSING DEVICE AND BOARD PRODUCTION SYSTEM

TECHNICAL FIELD

The present disclosure relates to an image processing device which is applied to a production facility which produces a board onto which electronic components are mounted, and relates to a board production system provided with the image processing device.

BACKGROUND ART

The production facility forms a production line of circuit board products as board production device, an inspection device, or the like. The production facility executes various production processes (including an inspection process) on a board. The production facility images a target object using an imaging device and controls the production process based on a state of the target object which is recognized by an image processing device using the image data which is acquired through the imaging. For example, in PTL 1, a component mounting machine in which the holding state of the electronic component which is held by a suction nozzle is recognized by performing image processing and reflected on the mounting control of the board is disclosed.

Incidentally, for the imaging device which is provided in the production facility, a lens unit which is set to a fixed focal length is often adopted in consideration of the fact that the distance to the target object of the imaging is generally fixed, the facility costs, and the like. The imaging device in which such a lens unit is adopted performs imaging using a predetermined camera visual field and acquires image data of a resolution corresponding to the number of pixels of an imaging device. Here, when the camera visual field is set to a wide area, the surface area which the target object occupies in the image data is small in a case in which the target object is small, and there is a concern that the resolution which is demanded in the image processing may not be secured.

Therefore, the lens unit of the imaging device is set to a camera visual field which is narrow to a certain extend in order to acquire image data in which a sufficient resolution is secured even if the target object is small. However, when such setting is performed, depending on the dimensions of the target object, there is a case in which the target object exceeds the camera visual field. Therefore, in PTL 2, a configuration is adopted in which high resolution data is acquired using super-resolution processing. Accordingly, even if the camera visual field is set to an area in which the target object fits, the image processing device is capable of performing image processing using high resolution data in which the necessary resolution is secured.

CITATION LIST

Patent Literature

PTL 1: JP-A-2013-26278
PTL 2: JP-A-11-191157

SUMMARY

Incidentally, as described in PTL 2, for super-resolution processing, multi-frame type super-resolution processing in which high resolution data is generated using a plurality of items of image data is known. In the multi-frame type super-resolution processing, processing time corresponding to the degree of the super-resolution processing is necessary. Therefore, in a case in which much image processing is executed in the production process of the board in the production facility, the cycle time of the production process may be extended.

The present disclosure is made in light of these issues, and an object thereof is to provide an image processing device capable of reducing the load of image processing while shortening the time required for the image processing which uses super-resolution processing.

An image processing device according to the present disclosure is an image processing device which is applied to a production facility which executes various production processes on a board, the production facility includes an imaging device which acquires image data through imaging a target object, and a control device which controls the production process based on a state of the target object which is recognized by the image processing device using the image data, and the image processing device includes a process determination section which determines an execution necessity of super-resolution processing in relation to the image data during execution of the production process for every type of the target object, a super-resolution processing section which executes the super-resolution processing which uses a plurality of items of the image data according to determination results of the process determination section to generate high resolution data, and a state recognition section which recognizes a state of the target object based on, of the image data and the high resolution data, the one corresponding to the determination results of the process determination section.

Effects

According to this configuration, the super-resolution processing section executes the super-resolution processing according to the determination results of the process determination section to generate the high resolution data. In other words, the image processing device switches between whether or not to execute the super-resolution processing depending on the type of the target object, and recognizes the state of the target object based on the low resolution data (the image data) or the high resolution data. Accordingly, in the recognition process of the target object of the image processing device, excessive execution of the super-resolution processing is suppressed. Therefore, in a case in which the image processing is performed across multiple types of target object, the time necessary for the image processing is shortened, and the load of the image processing is reduced.

DESCRIPTION OF EMBODIMENTS

Hereinafter, the embodiments that embody the image processing device and the board production system of the present disclosure will be described with reference to the drawings. The image processing device is applied to a production facility which forms a board production system of a circuit board product. Examples of a production facility include a board production device, an inspection device, and an off-line auxiliary device of a production line in a board production system.

Embodiment

Overall Configuration of Board Production System

Figure 1:
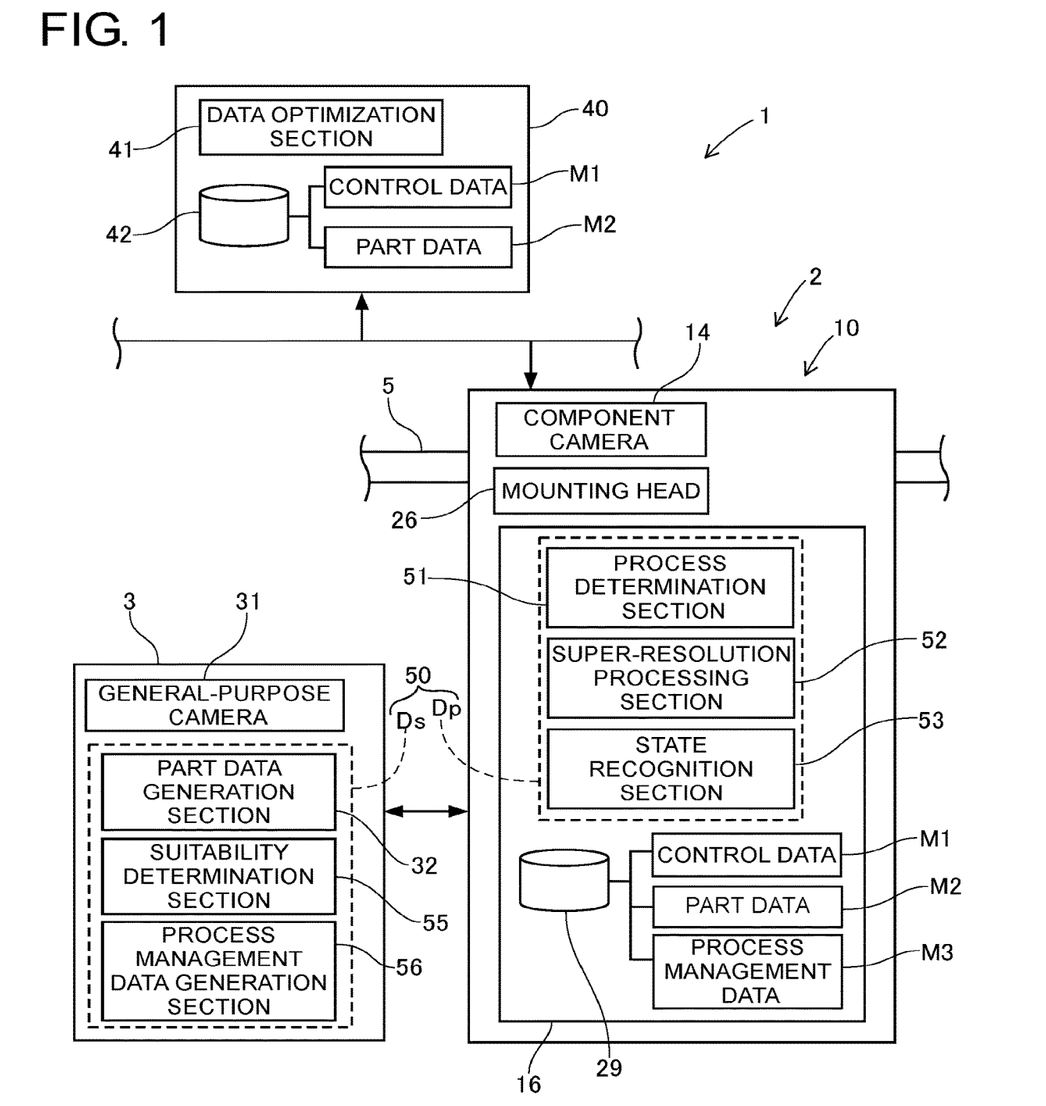
FIG. 1 is a block diagram illustrating the entirety of a board production system in an embodiment.

Description will be given of the overall configuration of a board production system 1 with reference to FIG. 1. As illustrated in FIG. 1, the board production system 1 is configured to include a production line 2, a camera stand 3, a board conveyance device 5, and a host computer 40. The production line 2 is configured by arranging a plurality of production facilities (board production devices and inspection devices) which execute various production processes on a board in a conveyance direction of the board.

Examples of a board production device include a component mounting machine 10 which mounts electronic components onto a board, a screen printer which is not depicted in the drawings, and the like. Examples of an inspection device include a print inspection device and an external appearance inspection device which are not depicted in the drawings. The various production facilities such as the board production device and the inspection device in the production line 2 are connected to be capable of communication with the host computer 40 via a network. Accordingly, the production facilities of the production line 2 are configured to be capable of input and output of various data between the production facilities and the host computer 40.

The camera stand 3 images a target object using an general-purpose camera 31 and executes various image processing. The general-purpose camera 31 is configured to be capable of moving relative to a loading table (not depicted in the drawings) on which electronic components are placed. The camera stand 3 includes a part data generation section 32 in the present embodiment. Before executing the mounting process of the electronic components by the component mounting machine 10 (the production process in the component mounting machine 10), the part data generation section 32 generates part data M2 which is used in the mounting process. In this manner, the camera stand 3 is a production facility which performs off-line assistance of the board production.

Here, "part data" is data which includes the component type, shape data, and the like relating to the specification of the electronic components. Specifically, the part data includes the type of the electronic component, an identification code which is allocated for every type, a vision type which is used in the comparison between the image processing in relation to the image data and the image data, the shape information relating to the shapes and dimensions, and the like. In a case in which the part data M2 is shared to be used in the mounting processes of a plurality of the component mounting machines 10, the part data M2 is stored in a storage device 42 of the host computer 40.

The part data generation section 32 performs image processing which uses the image data which is captured and acquired by the general-purpose camera 31. The target object of the imaging of the general-purpose camera 31 is a type of electronic component which is mounted onto a board in the mounting process of the component mounting machine 10. The part data generation section 32 recognizes the external shape of the electronic component by performing image processing and relates the various information including the external shape of the electronic component for every type of electronic component to generate the part data M2.

The board conveyance device 5 is formed using a belt conveyor and the like, and sequentially conveys the board in the conveyance direction. The board conveyance device 5 positions the board in a predetermined position inside of the component mounting machine 10. After the mounting process by the component mounting machine 10 is executed, the board conveyance device 5 conveys the board to the outside of the component mounting machine 10.

The host computer 40 monitors the operational situation of the production line 2 and performs control of the board production devices and the like including the component mounting machine 10. The host computer 40 includes a data optimization section 41 and the storage device 42. The data optimization section 41 optimizes mounting data M1 which is used by the component mounting machine 10 in the mounting process. The mounting data M1 is an operation program in which the mounting order of the electronic components is defined.

The data optimization section 41 changes the mounting order of the electronic component in the mounting data so as to shorten the takt time of the production process as much as possible. Specifically, the data optimization section 41 considers the coordinates on a board Bd onto which the electronic components are mounted, the mounting environment such as the supply position for every type of the electronic components, and the like to execute the optimization process. According to the optimization of the mounting data M1, the movement distance of amounting head 26 which will be described later is shortened, the waiting time is shortened, and the like, and thus, an improvement in production efficiency is obtained.

The storage device 42 of the host computer 40 is formed of a hard disk, flash memory, or the like. Various data for controlling the board production device is stored in the storage device 42. Specifically, the storage device 42 stores the production plans including the board type and production quantity to be produced, the mounting data M1 which is optimized by the data optimization section 41, and the like.

(Configuration of Component Mounting Machine 10)

Figure 2:
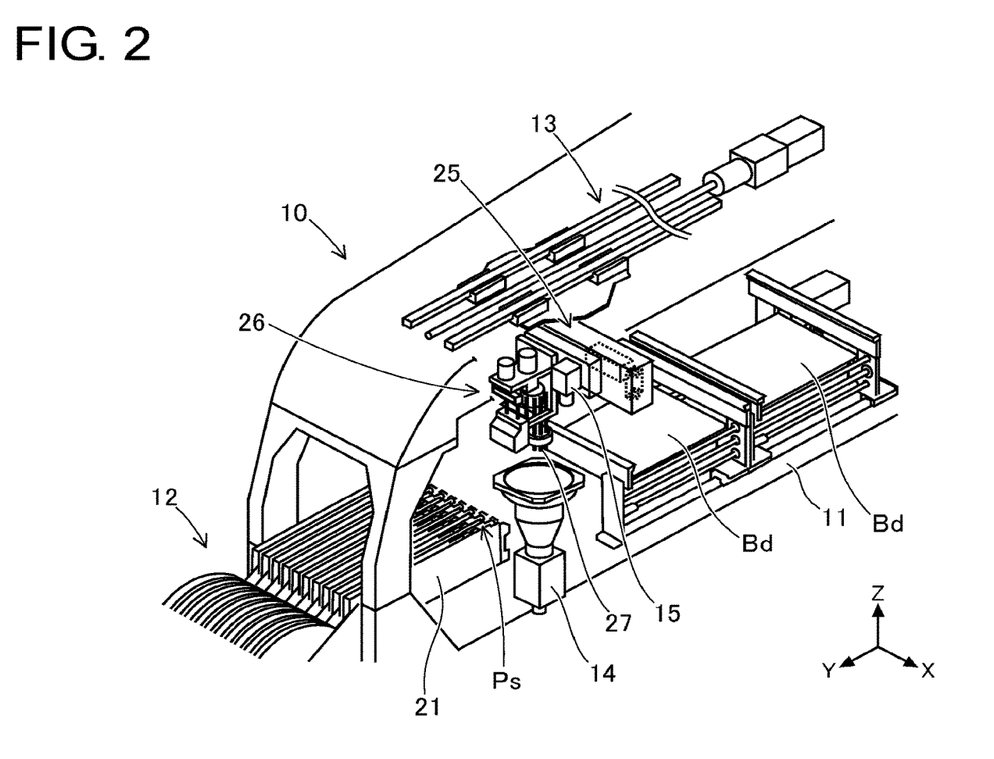
FIG. 2 is an overall diagram illustrating a component mounting machine in FIG. 1.

Description will be given of the configuration of the component mounting machine 10 with reference to FIGS. 1 and 2. The component mounting machine 10 is configured to include a base 11, a component supply device 12, a component transfer device 13, a component camera 14, a board camera 15, and a control device 16. Each of the devices 12, 13, and the component camera 14 is provided on the base 11 of the component mounting machine 10. As illustrated in FIG. 2, the horizontal width direction of the component mounting machine 10 (a direction heading from the upper left to the lower right in FIG. 2) is an X-axis direction, the horizontal longitudinal direction of the component mounting machine 10 (a direction heading from the upper right to the lower left in FIG. 2) is a Y-axis direction, and the vertical height direction (an up-down direction in FIG. 2) is a Z-axis direction.

The component supply device 12 is a device which supplies electronic components to be mounted onto the board Bd. The component supply device 12 is disposed on the front portion side (the lower left side in FIG. 2) in the Y-axis direction of the component mounting machine 10. In the present embodiment, the component supply device 12 is a feeder system device which uses a plurality of cassette system feeders 21. The component supply device 12 pitch feeds a component wrapping tape in which electronic components are stored at a predetermined interval. Accordingly, the component supply device 12 supplies the electronic components at a supply position Ps which is positioned at a tip side (the upper right side in FIG. 2) of the feeder 21.

The component transfer device 13 is configured to be capable of moving in the X-axis direction and the Y-axis direction. The component transfer device 13 is arranged from the rear portion side (the upper right side in FIG. 2) of the longitudinal direction of the component mounting machine 10 to above the component supply device 12 of the front portion side. The component transfer device 13 is provided with a head driving device 25, the mounting head 26, and a plurality of suction nozzles 27. The head driving device 25 is configured to be capable of moving a moving table in the X- and Y-axis directions using a linear motion mechanism. The mounting head 26 is provided to be capable of being attachable and detachable in relation to the moving table of the head driving device 25.

Each of the suction nozzles 27 is provided to be attachable and detachable in relation to the mounting head 26. The mounting head 26 supports the suction nozzles 27 to be capable of rotating around an R-axis which is parallel to the Z-axis, and to be capable of lifting and lowering the suction nozzles 27. The lifting and lowering position and the angle in relation to the mounting head 26, and the supply state of a negative pressure of each of the suction nozzles 27 is controlled. Each of the suction nozzles 27 sucks and holds an electronic component which is supplied at the supply position Ps at the tip portion due to a negative pressure being supplied. In this manner, the component transfer device 13 includes a function of holding the electronic components in the component mounting machine 10 and corresponds to a "holding device" of the present disclosure.

The component camera 14 and the board camera 15 are digital imaging devices which include an imaging device such as a CCD (Charge Coupled Device), a CMOS (Complementary Metal Oxide Semiconductor), or the like. The component camera 14 and the board camera 15 execute imaging process of an area which fits within the camera visual field based on the control signals of the control device 16 which is connected to be capable of communication. The component camera 14 and the board camera 15 transmit image data, which is acquired through the imaging of the target object, to the control device 16.

The component camera 14 is fixed to the base 11 and uses the electronic components which are held by the suction nozzles 27 as the target objects of the imaging. The lens unit of the component camera 14 is set such that the focal point is on the target object which is a fixed distance from the imaging device. A camera visual field Fv of the lens unit of the component camera 14 is set to an area in which all of the plurality of suction nozzles 27 which are held by the mounting head 26 fit. In other words, when imaging is performed using the component camera 14 which is set to this camera visual field Fv, it is possible to fit all of the electronic components which are held by the plurality of suction nozzles 27 in a single frame of image data.

The control device 16 which acquires the image data from the component camera 14 recognizes the holding state of the electronic component of the suction nozzle 27 by performing image processing. An improvement in the precision of the mounting process is obtained through the control device 16 correcting the position and the angle of the suction nozzle 27 according to the holding state of the electronic component. Detailed description of the recognition process of the holding state of the electronic component will be given later.

The board camera 15 is fixed to the moving table of the head driving device 25 and uses the board which is positioned inside of the component mounting machine 10 as the target object of the imaging. The control device 16 which acquires the image data from the board camera 15 recognizes, for example, board marks which are attached to the board Bd by performing image processing to recognize the positioning state of the board Bd by the board conveyance device 5. The control device 16 corrects the position of the moving table of the head driving device 25 according to the positioning state of the board Bd.

The control device 16 is mainly formed of a CPU, various memory, and a control circuit. The mounting data M1 for causing the component mounting machine 10 to operate, the image data which is transferred from the component camera 14 and the board camera 15, and the like are stored in a memory section 29 of the control device 16. The control device 16 controls the mounting process based on the state of the target object which is recognized by an image processing device 50, which is described later, using the acquired image data. The control device 16 corrects the operations of the component supply device 12, the component transfer device 13, and the like using the information which is acquired through the image processing based on the mounting data M1. Accordingly, an improvement in the precision of the mounting process is obtained.

(Configuration of Image Processing Device 50)

Description will be given of the configuration of the image processing device 50 which is applied to the component mounting machine 10 and the camera stand 3. Here, a mode will be exemplified in which "production facilities" of the present disclosure are "the component mounting machine 10" and "the camera stand 3", and a "target object" of the present disclosure is "an electronic component" which is held by the holding device (the component transfer device 13) of the component mounting machine 10.

The various image processing performed by the image processing device 50 includes a process of recognizing the holding state of the electronic component (corresponding to "state of target object" of the present disclosure) which is used by the control device 16 of the component mounting machine 10 when correcting the position and the angle of the suction nozzle 27. The recognition process of the holding state uses the image data which is acquired through the imaging of the component camera 14.

Here, as described above, in the lens unit of the component camera 14, the focal length is set to be fixed, and the camera visual field is set in consideration of the area in which the plurality of suction nozzles 27 which are supported by the mounting head 26 are arranged. Therefore, in a case in which the acquired image data is used without change in the recognition process of the holding state, the surface area which a small component occupies in the image data is small, and there is a concern that the resolution which is demanded in the recognition process may not be secured.

Therefore, in the present embodiment, the image processing device 50 performs super-resolution processing according to requirements such as the target of the mounting process being a small component. In this manner, in the recognition process of the holding state of the electronic component, the image processing device 50 obtains an improvement in the precision of the recognition process by using the high resolution data in which the demanded resolution is secured.

As illustrated in FIG. 1, the image processing device 50 is provided with a mounting machine-side processing section Dp which is provided in the component mounting machine 10, and an auxiliary device-side processing section Ds which is provided in the camera stand 3. The mounting machine-side processing section Dp includes a process determination section 51, a super-resolution processing section 52, and a state recognition section 53. The auxiliary device-side processing section Ds includes the part data generation section 32, a suitability determination section 55, and a process management data generation section 56.

The process determination section 51 of the mounting machine-side processing section Dp determines the execution necessity of the super-resolution processing on the image data for every type of electronic component during the execution of the mounting process of the electronic components by the component mounting machine 10. Specifically, each time the suction nozzle 27 holds an electronic component in the mounting process, the process determination section 51 determines whether or not to execute the super-resolution processing according to the type of the electronic component. In the present embodiment, the process determination section 51 determines the execution necessity of the super-resolution processing based on process management data M3. The process management data M3 will be described in detail below.

During the execution of the mounting process of the electronic component by the component mounting machine 10, the super-resolution processing section 52 executes the super-resolution processing which uses the plurality of items of image data according to the determination results of the process determination section 51 to generate the high resolution data. The super-resolution processing is image processing which increases the resolution of the input image data, and a plurality of types of processing method are known. The super-resolution processing section 52 adopts multi-frame type super-resolution processing. Specifically, the super-resolution processing section 52 performs super-resolution processing which uses the plurality of items of image data which are captured at imaging positions in which the relative positions of the component camera 14 to the electronic component differ from each other.

The super-resolution processing section 52 does not necessarily execute the super-resolution processing every time the suction nozzle 27 holds an electronic component in the mounting process. In other words, according to the determination results of the process determination section 51, the super-resolution processing section 52 executes the super-resolution processing using the image data in which the electronic component corresponding to a defined type is used as the target object. In this manner, the image processing device 50 is configured to switch between whether or not to execute the super-resolution processing depending on the type of the electronic component.

During the execution of the mounting process of the electronic component by the component mounting machine 10, the state recognition section 53 recognizes the state of the electronic component based on, of the image data and the high resolution data, the one corresponding to the determination results of the process determination section 51. Here, the state of the electronic component is the holding state which includes the position and the angle of the electronic component which is held by the suction nozzle 27.

In a case in which the process determination section 51 determines that the execution of the super-resolution processing is "necessary", the state recognition section 53 performs the recognition process of the electronic component based on the high resolution data which is generated by the super-resolution processing section 52. Meanwhile, in a case in which the process determination section 51 determines that the execution of the super-resolution processing is "unnecessary", the state recognition section 53 performs the recognition process of the electronic component based on the image data which is acquired through the imaging of the component camera 14 (hereinafter, also referred to as "low resolution data").

Here, when the surface area which the electronic component, which is the target of the recognition of the holding state, occupies in the image data is small, the recognition precision is reduced. This is because, when the number of pixels which are used for indicating a certain side of the electronic component falls below a predetermined number of pixels, for example, it becomes difficult to derive the length and the angle of that side. Therefore, the high resolution data in which one side of the electronic component is depicted using a predetermined number of pixels is generated using the super-resolution processing, and is used in the recognition of the holding state.

Accordingly, the state recognition section 53 recognizes the holding state which includes the position in the X-axis direction and the Y-axis direction of the electronic component in relation to the suction nozzle 27, and the rotational angle of the electronic component in relation to a center axis of the suction nozzle 27. The state recognition section 53 repeats the same process a number of times corresponding to a predetermined number of electronic components T, a plurality of which are held by the plurality of suction nozzles 27 which are supported by the mounting head 26. The state recognition section 53 stores the holding state of each of the electronic components in the memory section 29.

Before the execution of the mounting process by the component mounting machine 10, the suitability determination section 55 of the auxiliary device-side processing section Ds determines whether or not the resolution of the image data which is acquired through the imaging of the electronic component is suitable for the recognition process of the state recognition section 53 for every type of target object. The image data which is used in the suitability determination by the suitability determination section 55 is acquired through the imaging of the general-purpose camera 31 of the camera stand 3. More specifically, in the present embodiment, the suitability determination section 55 reuses the image data which is used in the generation of the part data M2 by the part data generation section 32.

Here, the image data which is used in the recognition process by the state recognition section 53 of the mounting machine-side processing section Dp is acquired through the imaging of the component camera 14 of the component mounting machine 10 during the mounting of the mounting process. Therefore, the image data which is used in the suitability determination of the suitability determination section 55 differs from the image data which is used in the recognition process of the state recognition section 53. Therefore, the suitability determination section 55 takes the difference between the performance of the general-purpose camera 31 of the camera stand 3 and the performance of the component camera 14 of the component mounting machine 10 into consideration to determine whether or not the image data is suitable for the recognition process of the state recognition section 53.

For example, it will be assumed that the performance of the general-purpose camera 31 is approximately the same as the performance of the component camera 14. In this case, the determination results of whether or not the resolution of the image data which is acquired through the imaging of the general-purpose camera 31 is suitable for the recognition process of the state recognition section 53 are the same as the results of performing the same suitability determination using the image data which is acquired through the imaging of the component camera 14. In contrast, in a case in which the camera visual field of the component camera 14 is a wider area than the camera visual field of the general-purpose camera 31, the suitability determination section 55 takes the fluctuation amount in the low resolution side caused by the difference in the camera visual field to perform the suitability determination.

Various methods are applied for the suitability determination of the suitability determination section 55. In the present embodiment, the suitability determination section 55 adopts a method of performing the suitability determination described above based on the high resolution data and the low resolution data. In other words, the suitability determination section 55 determines whether or not the resolution of the image data is suitable for the recognition process of the state recognition section 53 based on the high resolution data which is generated by the super-resolution processing which uses the plurality of items of image data which are acquired through the imaging of the electronic component by the general-purpose camera 31, and any of image data (the low resolution data) which is used in the super-resolution processing.

More specifically, the suitability determination section 55 performs the image processing of recognizing the position of the electronic component on each of the high resolution data and the low resolution data, for example. In a case in which the positions of the electronic components which are recognized fall within an allowable error, the suitability determination section 55 determines that the resolution of the low resolution data is suitable for the recognition process of the state recognition section 53. Meanwhile, in a case in which the positions of the electronic components which are recognized exceed the allowable error, or in a case in which the positions of the electronic components may not be recognized in the low resolution data, it is determined that the resolution of the low resolution data is unsuitable for the recognition process of the state recognition section 53.

The process management data generation section 56 generates the process management data M3 in which the execution necessity of the super-resolution processing is set for every type of electronic component based on the determination results of the suitability determination section 55. In the present embodiment, as illustrated in the table on the right side in FIG. 4, in the process management data M3, the necessity of the super-resolution processing (necessary, necessary, unnecessary, . . . ) is set for every type of electronic component (A, B, C . . . ). During the generation of the process management data M3, the process management data generation section 56 sets that the super-resolution processing is necessary in a case in which the determination results of the suitability determination section 55 is "unsuitable", and sets that the super-resolution processing is unnecessary in a case in which the determination results of the suitability determination section 55 is "suitable".

The process management data generation section 56 transmits the generated process management data M3 to the component mounting machine 10. The component mounting machine 10 stores the acquired process management data M3 in the memory section 29. During the execution of the mounting process of the component mounting machine 10, the process determination section 51 of the mounting machine-side processing section Dp determines the execution necessity of the super-resolution processing based on the process management data M3.

(Generation Processes of Part Data M2 and Process Management Data M3)

Figure 5:
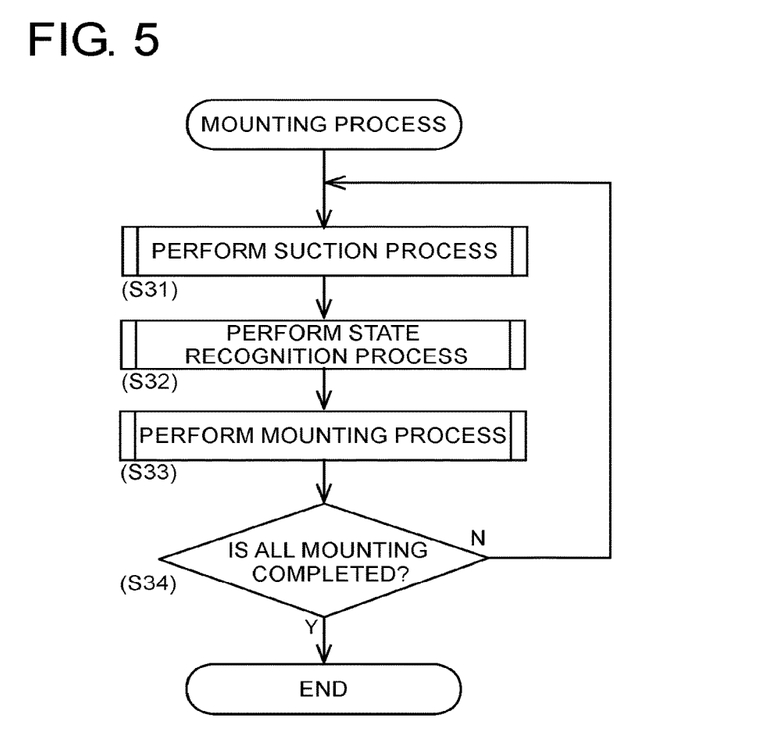
FIG. 5 is a flowchart illustrating a mounting process of the component mounting machine.

Description will be given of the generation processes of the part data M2 and the process management data M3 in the camera stand 3 described above, with reference to FIG. 3. The generation processes of the data M2 and M3 is performed before the execution of the mounting process by the component mounting machine 10. As illustrated in FIG. 5, in the generation processes of the data M2 and M3, first, the electronic component is set on the loading table of the camera stand 3 (step 11 (hereinafter, "step" will be denoted as "S")).

Figure 3:
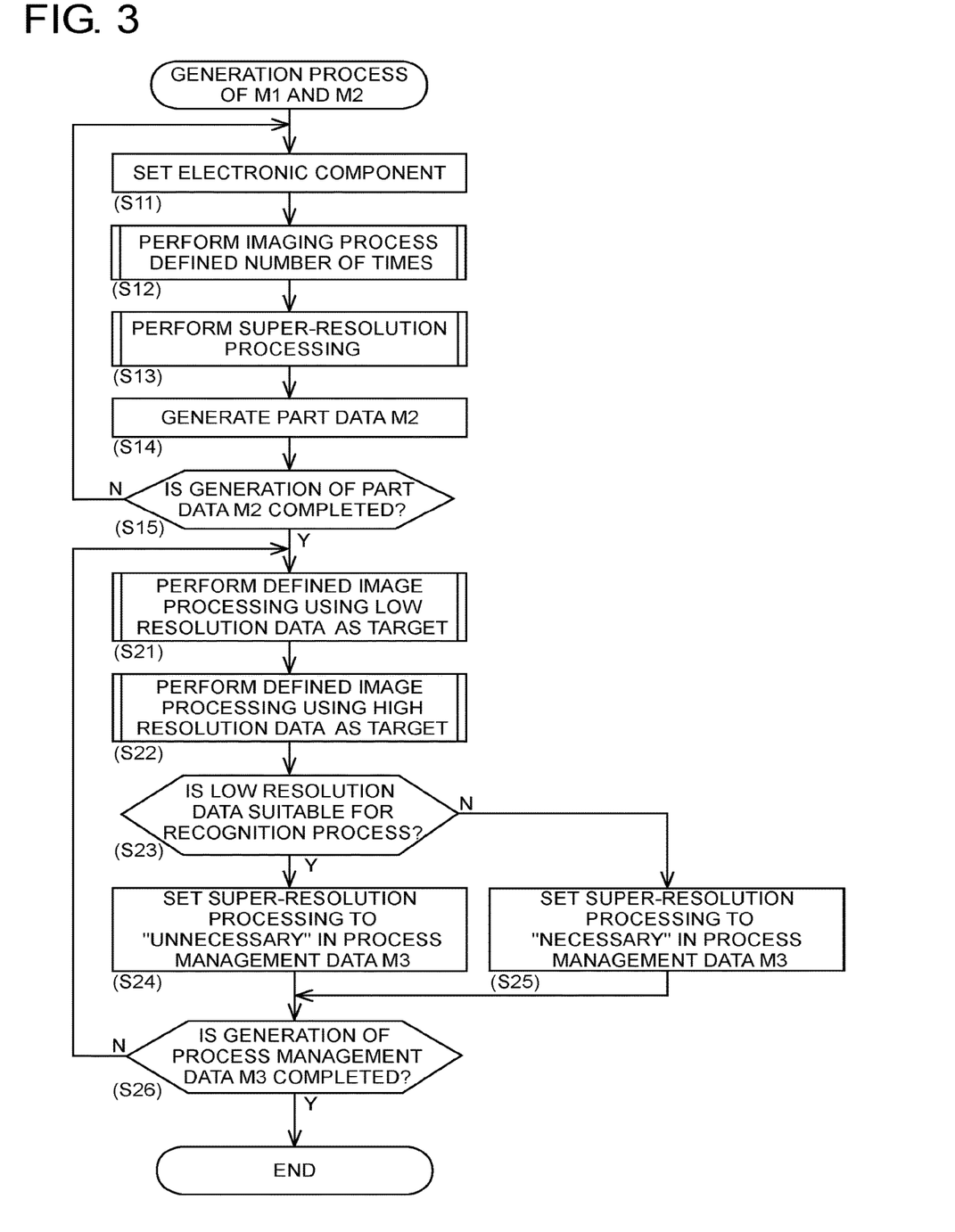
FIG. 3 is a flowchart illustrating apart data generation process and a process management data generation process.

Next, the auxiliary device-side processing section Ds performs the imaging process of the electronic component using the general-purpose camera 31 over a defined number of times (S12). The imaging process is for using the image data which is used in the subsequent super-resolution processing. Specifically, in the imaging process, the electronic component is imaged at imaging positions of a plurality of locations (corresponding to the defined number of times) at which the relative positions of the general-purpose camera 31 to the electronic component differ from each other. The "imaging positions of a plurality of locations" are positions which are shifted from each other by an amount obtained by adding a distance which is smaller than the interval between pixels in the imaging device of the general-purpose camera 31, for example, to a distance which is an integer multiple of the interval.

The "defined number of times" is a number of times to perform imaging which is defined such that a reference resolution is secured in the high resolution data which is generated using the multi-frame type super-resolution processing. In other words, by performing the super-resolution processing which uses the plurality of items of image data which are captured by performing the imaging greater than or equal to the defined number of times, high resolution data which has at least the reference resolution which is suitable for the recognition process of the state recognition section 53 is generated. For the defined number of times, a different value may be set for every type of electronic component, and a fixed value may be set for any type.

Next, the auxiliary device-side processing section Ds executes the super-resolution processing which uses the plurality of items of image data to generate the high resolution data (S13). Specifically, the auxiliary device-side processing section Ds first performs alignment of the plurality of items of image data. For example, the alignment is performed based on the results of image processing in which instruction values causing the general-purpose camera 31 to move relative to the loading table of the camera stand 3 during the imaging, and reference points included in the image data are caused to match. The auxiliary device-side processing section Ds executes a reconstruction process which generates the high resolution data based on the plurality of items of image data which are aligned. According to the super-resolution processing, the auxiliary device-side processing section Ds acquires the high resolution data in which the electronic component is depicted using a predetermined number of pixels.

The part data generation section 32 generates the part data M2 corresponding to the type of the electronic component which is set in S11 using the high resolution data which is acquired through the super-resolution processing of S13 (S14). The auxiliary device-side processing section Ds determines whether or not the generation of the part data M2 is completed for all types of electronic component which are targeted (S15).

In a case in which there are types of target electronic component remaining (S15: No), the processes described above (S11 to S15) are repeated. In a case in which the generation of the part data M2 is completed for all of the electronic component types (S15: Yes), the generation process of the part data M2 (S11 to S15) is completed, and the process transitions to the generation process of the process management data M3.

The auxiliary device-side processing section Ds uses one among the plurality of items of image data which are acquired through the imaging of S12 as the low resolution data, and performs defined image processing which uses the low resolution data (S21). Furthermore, the auxiliary device-side processing section performs defined image processing which uses the high resolution data which is acquired through the super-resolution processing of S13 (S22). The defined image processing (S21 and S22) include binarization, edge extraction, and the like, for example. The position, the angle, and the external shape of the electronic component in each item of image data are recognized through the defined image processing (S21 and S22).

Next, the suitability determination section 55 determines (S23) whether or not the low resolution data is suitable for the recognition process of the state recognition section 53 based on the results of the defined image processing (S21 and S22). In the present embodiment, the suitability determination section 55 performs the suitability determination according to whether or not the position of the electronic component which is recognized using the low resolution data in S21 falls within a range of allowable error in relation to the position of the electronic component which is recognized using the high resolution data in S22. This uses the fact that, in a case in which the resolution of the low resolution data is greater than or equal to a fixed level, the position of the electronic component which is recognized using the image processing is the same as the result (the position of the electronic component) of the image processing which uses the high resolution data.

In a case in which the low resolution data is suitable for the recognition process of the state recognition section 53 (S23: Yes), the suitability determination section 55 sets the super-resolution processing in the process management data M3 as "unnecessary" during the execution of the mounting process of the component mounting machine 10 for the corresponding electronic component type (S24). Meanwhile, in a case in which the low resolution data is not suitable for the recognition process of the state recognition section 53 (S23: No), the suitability determination section 55 sets the super-resolution processing in the process management data M3 as "necessary" during the execution of the mounting process of the component mounting machine 10 for the corresponding electronic component type (S25).

The auxiliary device-side processing section Ds determines whether the setting (S24 and S25) relating to the necessity of the super-resolution processing is completed for all types of electronic component which are used as targets (S26). In a case in which there are types of target electronic component remaining (S26: No), the processes described above (S21 to S26) are repeated. In a case in which the setting (S24 and S25) relating to the necessity of the super-resolution processing is completed for all types of electronic component (S26: Yes), the generation process (S21 to S26) of the process management data M3 is completed.

Figure 4:
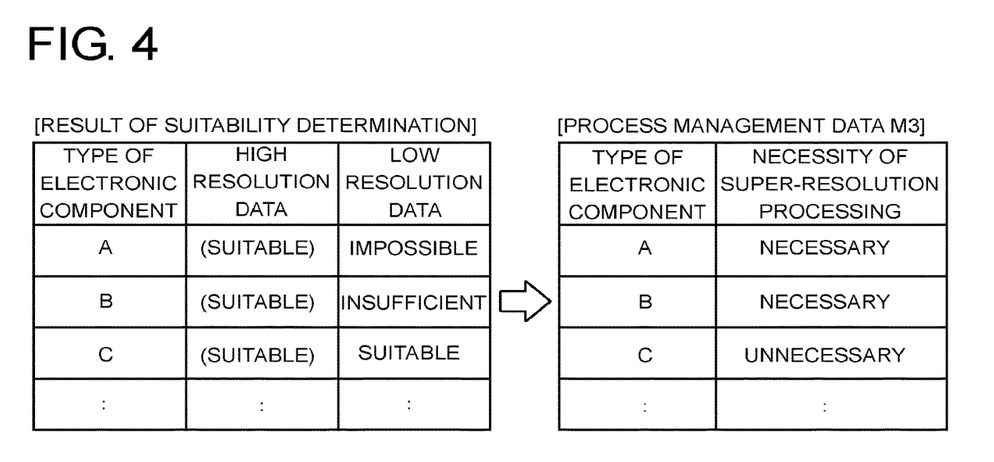
FIG. 4 is a diagram illustrating the relationship between suitability determination results and the process management data.

According to the processes described above (S21 to S26), as illustrated in FIG. 4, the process management data M3 in which the execution necessity of the super-resolution processing is set for all types of electronic component which are used as targets is generated automatically. Here, the determination results of the suitability determination section 55 and the process management data M3 are related as illustrated in FIG. 4. For example, in a case in which the suitability determination section 55 is not able to recognize the position of the electronic component through the image processing of S21 for a type A of electronic component, as illustrated in the table of the left side of FIG. 4, the suitability determination section 55 evaluates the low resolution data of the type A to be "impossible", In a case in which, although the suitability determination section 55 is able to recognize the position of the electronic component through the image processing of S21 for a type B of electronic component, the recognized position and the position of the electronic component which is recognized through the image processing which uses the high resolution data exceed the allowable error, the suitability determination section 55 evaluates the low resolution data of the type B as "insufficient". In a case in which the position of the electronic component which is recognized through the image processing of S21 for a type C of electronic component falls within the range of the allowable error in relation to the position of the electronic component which is recognized in S22, the suitability determination section 55 evaluates the low resolution data of the type C as "suitable".

As described above, in a case in which the suitability determination section 55 evaluates the low resolution data as "impossible" or "insufficient" (S23: No), the process management data generation section 56 sets the low resolution data relating to the corresponding types A and B of electronic component as not suitable for the recognition process of the electronic components and sets "necessary" for the necessity of the super-resolution processing (table of the right side of FIG. 4). In a case in which the suitability determination section 55 evaluates the low resolution data as "suitable" (S23: Yes), the process management data generation section 56 sets "unnecessary" for the necessity of the super-resolution processing during the execution of the mounting process for the corresponding type C of electronic component.

(Mounting Control of Electronic Component)

Description will be given of the mounting process of the electronic component by the component mounting machine 10 with reference to FIG. 5. In the mounting process, the control device 16 of the component mounting machine 10 first executes a suction process in which the plurality of suction nozzles 27 are caused to sequentially suck the electronic components according to the mounting data M1 (S31). Next, the control device 16 causes the mounting head 26 to move over the mounting position on the board Bd.

While the mounting head 26 is moving, the mounting machine-side processing section Dp executes the recognition process of the holding states of the electronic components which are held by the suction nozzles 27 (S32).

Subsequently, the control device 16 of the component mounting machine 10 executes the mounting process in which the electronic components are sequentially mounted onto the board Bd (S33). The control device 16 determines whether or not the mounting of all of the electronic components is completed (S34), and repeats the processes described above (S31 to S34) until the mounting is completed.

Using the results of the recognition process (S32) of the state of the electronic components, the control device 16 recognizes the presence of the electronic components which are sucked by the suction nozzles 27, whether or not the held electronic components are correct, the holding state of the electronic components of the suction nozzles 27, and the like. In a case in which the mounting target electronic components are correct, the control device 16 corrects the positions and the angles of the suction nozzles 27 according to the holding state of the electronic components and controls the mounting process of the electronic components.

(Recognition Process of Holding State of Electronic Component)

Figure 6:
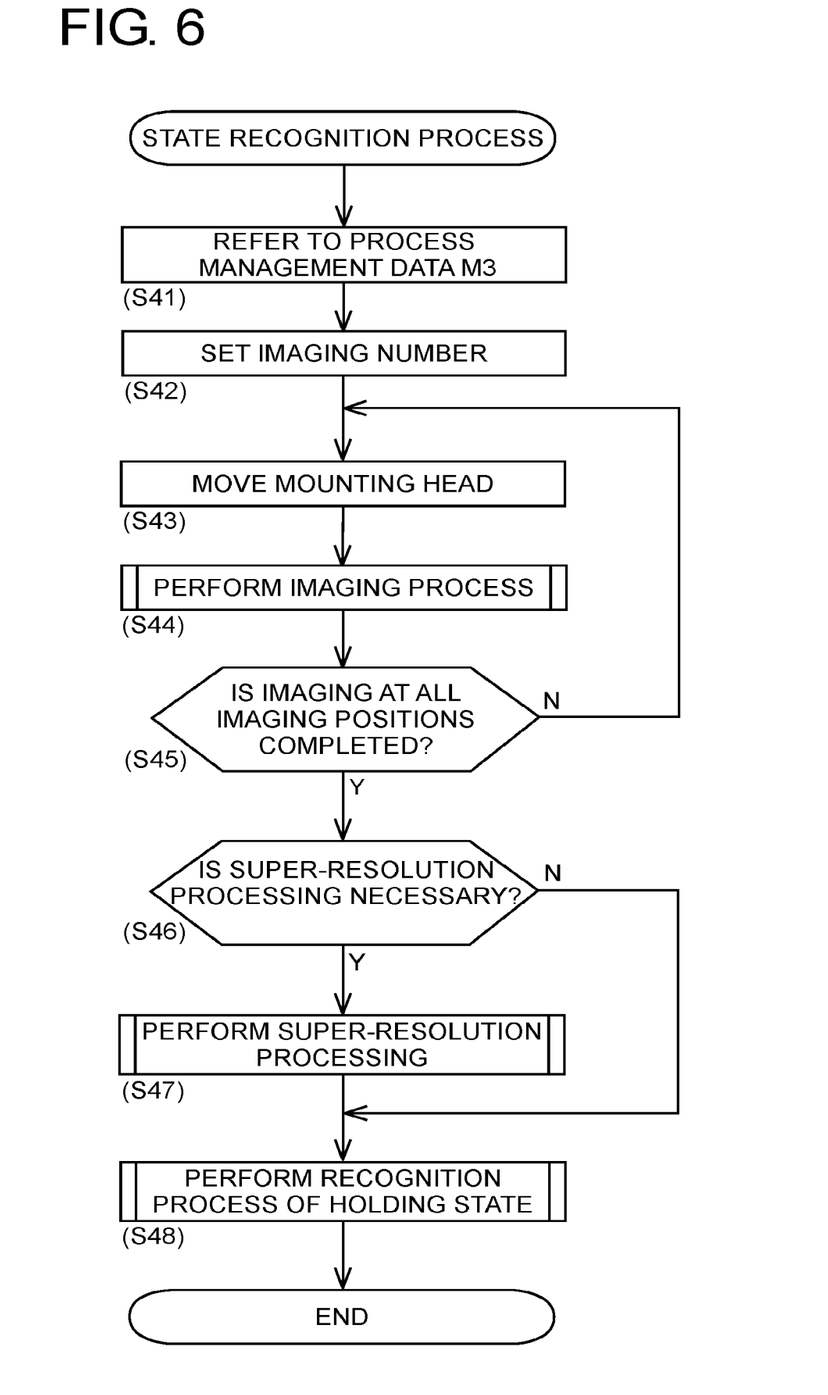
FIG. 6 is a flowchart illustrating a recognition process of a holding state.

Description of the recognition process (S32) of the holding state of the electronic component will be with reference to FIGS. 5 and 6. The mounting machine-side processing section Dp references the process management data M3 which is generated by the auxiliary device-side processing section Ds of the camera stand 3 before the execution of the mounting process of the component mounting machine 10 (S41). The mounting machine-side processing section Dp acquires the execution necessity of the super-resolution processing for the type of electronic component which is currently held by the suction nozzle 27 using the suction process (S31).

The mounting machine-side processing section Dp sets an imaging number based on the execution necessity of the acquired super-resolution processing (S42). Specifically, in a case in which the execution necessity of the super-resolution processing is set to necessary for the type of electronic component which is held by the suction nozzle 27, a predefined "four times", for example, is set as the imaging number. This corresponds to the number of items of image data which are used in the super-resolution processing. In a case in which the execution of the super-resolution processing is unnecessary, the imaging number is set to "one time". In a case in which the plurality of suction nozzles 27 are holding different types of electronic component, the imaging number is set to a maximum number.

The control device 16 causes the mounting head 26 to move to the first imaging position (S43). The first imaging position is a position at which the optical axis of the component camera 14 matches the center of the rotational member which holds the plurality suction nozzles 27 to be capable of rotating in the mounting head 26, for example. The control device 16 performs the imaging process of the plurality of electronic components (S44).

Specifically, the control device 16 inputs the fact that the suction nozzles 27 which are supported by the mounting head 26 are above the component camera 14 using the motor control circuit of the control device 16. The control device 16 transmits a control instruction to the component camera 14 such that the component camera 14 performs the imaging. Accordingly, all of the electronic components which are in a state of being held by the plurality of suction nozzles 27 are imaged, and the image data obtained through the imaging is stored in the memory section 29.

Next, the control device 16 determines whether the imaging at the four imaging positions is completed (S45), and in a case in which the imaging is not completed (S45: No), repeats the processes described above (S43 to S45). When causing the mounting head 26 to move again, the control device 16 causes the mounting head 26 to move in the X-axis direction or the Y-axis direction by a distance corresponding to half of the interval between pixels in the imaging device (S43). The control device 16 performs the imaging process of the electronic components which are moved by half a pixel again (S44).

When the imaging is completed at all of the imaging positions (S45: Yes), the memory section 29 stores the image data of the first imaging process. In a case in which the imaging number which is set in S42 is "four times", in addition to the image data described above, the memory section 29 stores image data which is shifted in the X-axis direction by half a pixel, image data which is shifted in the Y-axis direction by half a pixel, and image data which is shifted in the X-axis direction and the Y-axis direction by half a pixel each.

Next, the process determination section 51 determines the execution necessity of the super-resolution processing in relation to the image data based on the process management data M3 (S46). In a case in which the execution of the super-resolution processing is necessary (S46: Yes), the super-resolution processing section 52 executes the super-resolution processing which uses the plurality of items of image data to generate the high resolution data (S47). Since the super-resolution processing is effectively the same as the super-resolution processing (S13) of the auxiliary device-side processing section Ds, detailed description thereof will be omitted.

In a case in which the super-resolution processing (S47) of the super-resolution processing section 52 is completed and the execution of the super-resolution processing is determined to be unnecessary by the process determination section 51 (S46: No), the state recognition section 53 executes the recognition process of the holding state including the position and the angle of the electronic component which is held by the suction nozzle 27 (S48). Here, the state recognition section 53 recognizes the holding state of the electronic component based on the one of the image data and the high resolution data which corresponds to the determination results of the process determination section 51.

In other words, in a case in which the determination results are "necessary" (S46: Yes), the state recognition section 53 uses the high resolution data which is generated by the super-resolution processing (S47) in the recognition process. Meanwhile, in a case in which the determination results are "unnecessary" (S46: No), the state recognition section 53 uses the image data (the low resolution data) which is generated by the imaging process (S44) in the recognition process as it is.

The state recognition section 53 executes the recognition process of the holding state based on the low resolution data or the high resolution data, and the part data M2 corresponding to the types of the electronic components. Specifically, the state recognition section 53 performs pattern matching based on the electronic components in the low resolution data or the high resolution data, the vision type, and the shape information of the part data M2. The state recognition section 53 causes the memory section 29 to store the shifting amounts in the X-axis direction and the Y-axis direction of the electronic components in relation to the suction nozzles 27, and the rotational angle of the electronic components in relation to the center axes of the suction nozzles 27 as the holding state of the electronic components, and completes the recognition process of the holding state.

Effect of Configuration of Embodiment

The image processing device 50 according to the present embodiment is applied to a production facility (the component mounting machine 10) which executes various production processes (mounting processes) on the board Bd. The production facility (the component mounting machine 10) is provided with an imaging device (the component camera 14) which images a target object (the electronic component) to acquire image data, and the control device 16 which controls the production process (the mounting process) based on the state of the target object (the electronic component) which is recognized by the image processing device 50 using the image data. The image processing device 50 is provided with the process determination section 51 which determines the execution necessity of the super-resolution processing in relation to the image data during the execution of the production process (the mounting process) for every type of target object (electronic component), the super-resolution processing section 52 which executes the super-resolution processing which uses the plurality of items of image data according to the determination results of the process determination section 51 to generate the high resolution data, and the state recognition section 53 which recognizes the state of the target object (the electronic component) based on, of the image data and the high resolution data, the one corresponding to the determination results of the process determination section 51.

According to this configuration, the super-resolution processing section 52 executes the super-resolution processing according to the determination results of the process determination section 51 to generate the high resolution data (S47). In other words, the image processing device 50 switches between whether or not to execute the super-resolution processing depending on the type of the electronic component, and recognizes the holding state of the electronic component based on the low resolution data or the high resolution data. Accordingly, in the recognition process of the electronic component of the image processing device 50, excessive execution of the super-resolution processing is suppressed. Therefore, in a case in which the image processing is performed across multiple types of electronic component, the time necessary for the image processing is shortened, and the load of the image processing is reduced.

The image processing device 50 is further provided with the suitability determination section 55 which determines whether or not the resolution of the image data which is acquired through the imaging of the target object (the electronic component) before the execution of the production process (the mounting process) is suitable for the recognition process of the state recognition section 53 for every type of target object (electronic component), and the process management data generation section 56 which generates the process management data M3 in which the execution necessity of the super-resolution processing is set for every type of target object based on the determination results of the suitability determination section 55 (electronic component). The process determination section 51 determines the execution necessity of the super-resolution processing based on the process management data M3 (S46).

According to this configuration, the process management data M3 which is referenced by the process determination section 51 is generated automatically (S21 to S26). The process management data M3 reflects the determination results of the suitability determination section 55 based on the image data which is acquired by actually imaging the electronic component. Accordingly, the execution necessity of the super-resolution processing is more suitably set in the process management data M3. Therefore, excessive execution of the super-resolution processing is reliably prevented. Since the process management data M3 is generated automatically, the work load of the operator is reduced.

The suitability determination section 55 determines whether or not the resolution of the image data is suitable for the recognition process of the state recognition section 53 based on the high resolution data which is generated by the super-resolution processing which uses the plurality of items of image data which are acquired through the imaging of the target object (the electronic component), and any of image data which is used in the super-resolution processing (S23).

According to this configuration, the suitability determination section 55 determines the suitability of the low resolution data by comparing the high resolution data which is actually generated, and the image data (the low resolution data) in which the super-resolution processing is not executed (S23). Accordingly, in a case in which it is determined that the low resolution data is suitable for the recognition process even if compared with the high resolution data (S23: Yes), unnecessary execution of the super-resolution processing is prevented. Meanwhile, in a case in which it is determined that the low resolution data is not suitable for the recognition process (S23: No), the super-resolution processing (S47) is executed appropriately, and a reduction in the precision of the recognition process is prevented.

The target object is an electronic component to be mounted onto the board Bd, the image processing device 50 is further provided with the part data generation section 32 which generates the part data M2 in which the various information including the external shape of the electronic component is related for every type of electronic component using the image data which is acquired through the imaging of the electronic component before the execution of the production process (the mounting process). The suitability determination section 55 determines whether or not the resolution of the image data, which is used in the generation of the part data M2 by the part data generation section 32, is suitable for the recognition process of the state recognition section 53 (S23).

According to this configuration, the suitability determination section 55 performs the determination based on the image data which is acquired through the imaging in which the electronic component is used as the target object in order to generate the part data M2 (S23). Accordingly, it is possible to reuse the image data without newly imaging the electronic component for the determination. Therefore, the process management data M3 is more efficiently generated. In order to recognize the shape of the electronic component included in the part data M2, the super-resolution processing is executed in the generation of the part data M2 (S13). The suitability determination section 55 is capable of reusing the high resolution data which is generated by the super-resolution processing (S13) in the suitability determination (S23) in the same manner.

The production facility is the component mounting machine 10 which mounts electronic components onto the board Bd, and the target objects (the electronic components) are electronic components which are held by the holding device of the component mounting machine 10. In the mounting process of the component mounting machine 10, there is a case in which the mounting of a large number of varying types of electronic components is demanded. According to the configuration of the image processing device 50 described above, it is possible to shorten the time which is necessary for the imaging process (S44) and the image processing (S47 and S48) during the execution of the mounting process, and to shorten the cycle time. Accordingly, it is particularly useful to apply the present disclosure to the component mounting machine 10.

Modification Example of Embodiment (Process Management Data M3)

Figure 7:
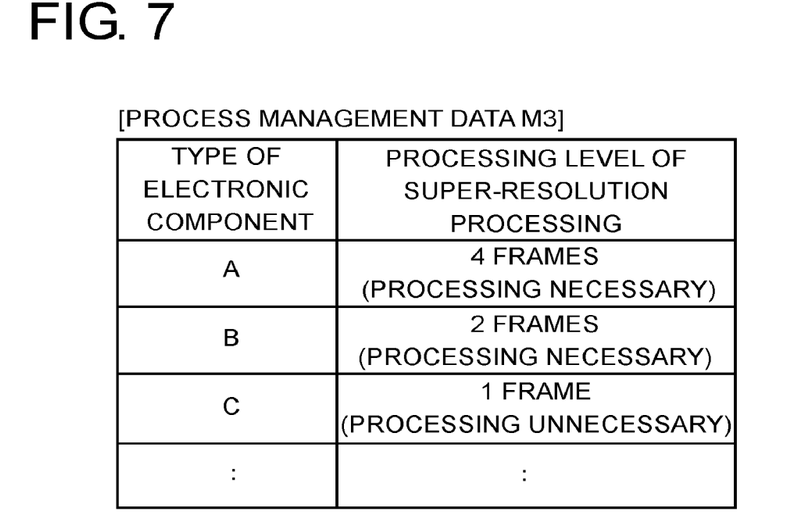
FIG. 7 is a diagram illustrating process management data in a modification example.

In the embodiment, as illustrated in the table of the right side of FIG. 4, the necessity of the super-resolution processing is set for every type of electronic component in the process management data M3. In comparison, a processing standard indicating the degree of super-resolution processing may be set for every type of target object (electronic component) in the process management data M3. Specifically, as illustrated in FIG. 7, the processing level of the process management data M3 may be defined using the number of items (frames) of image data which are used when the super-resolution processing section 52 generates the high resolution data.

The super-resolution processing section 52 acquires the processing level corresponding to the type of the target object from the process management data M3 during the execution of the super-resolution processing. The super-resolution processing section 52 generates the high resolution data which satisfies the processing level through the super-resolution processing which uses the plurality of items of image data. According to this configuration, the super-resolution processing section 52 executes the super-resolution processing according to the processing level which is preset for every type of target object (electronic component).

In other words, in addition to switching between executing or not executing the super-resolution processing, in a case in which the super-resolution processing is executed, the image processing device 50 executes the super-resolution processing using processing content which is set in a graded manner. Generally, in the multi-frame type super-resolution processing, the greater the number of items of image data which are used in the processing, the higher the resolution of image data may be obtained; however, a corresponding processing time is necessary. To counter this, since, according to the configuration described above, it is possible to set the processing level according to the type of target object (electronic component), it is possible to prevent the degree of super-resolution processing from becoming excessive.

In a case in which the processing level is defined using the number of items of image data which are used in the super-resolution processing, the operator is capable of referring to the process management data M3 to confirm the degree of super-resolution processing by the number of items of image data. Therefore, the manageability of the process management data M3 is improved. Besides the number of items of image data, a mode in which the processing level is defined using a target resolution or the like may be adopted for the processing level. In this configuration, since the number of items of image data is determined as suitable according to the performance of the component camera 14, the versatility of the process management data M3 is improved.

In the embodiment, the process management data M3 is generated automatically using the generation process (S21 to S26) of the auxiliary device-side processing section Ds. In contrast, the process management data M3 may be generated by the operator or the manager of the production line 2 based on a production record or the like. In this mode, in addition to the mounting data M1 and the part data M2, the component mounting machine 10 acquires the process management data M3 from the host computer 40 before the execution of the mounting process.

(Suitability Determination of Suitability Determination Section 55)

In the embodiment, the suitability determination section 55 determines (S23) whether or not the resolution of the low resolution data is suitable for the recognition process of the state recognition section 53 based on the high resolution data which is generated by the super-resolution processing (S13) and any of low resolution data which is used in the super-resolution processing (S13). In contrast, the suitability determination section 55 may perform the suitability determination using another mode without depending on a comparison between the high resolution data and the low resolution data.

For example, the suitability determination section 55 may adopt a method of comparing the position of the target object which is derived from the relative positions of the imaging device and the target object during the imaging, and the position of the target object which is acquired through the image processing in relation to the image data. Specifically, the image processing device 50 first derives the position of the electronic component based on a command value which causes the general-purpose camera 31 to move relative to the loading table of the camera stand 3 in the imaging process (S12).

The image processing device 50 calculates the position of the electronic component in relation to the general-purpose camera 31 through image processing in relation to the image data. The suitability determination section 55 performs suitability determination according to whether or not the position in the image data in relation to the position in the control falls within the range of allowable error. According to this configuration, since it is not necessary to execute the super-resolution processing for the suitability determination, the image processing device 50 is capable of reducing the processing load.

(Optimization of Mounting Data M1)

In the embodiment, the board production system 1 is provided with the data optimization section 41 which optimizes the mounting data M1. The data optimization section 41 may be configured to optimize the mounting data M1 based on the coordinates on the board onto which electronic components are to be mounted, and the necessity of the super-resolution processing in the process management data M3.

In the optimization process of the mounting data M1, in a case in which the mounting head 26 includes a plurality of the suction nozzles 27, for example, in the suction process (S31), electronic components of the same type or electronic components with close supply positions Ps are grouped inside the mounting data M1. The data optimization section 41 reorders the mounting order such that the electronic components of types which are grouped are mounted onto the board Bd in consecutive processes (S31 to S33).

Here, the data optimization section 41 may optimize the mounting data M1 based on the coordinates on the board Bd onto which electronic components are to be mounted, and the necessity of the super-resolution processing in the process management data M3. In other words, the data optimization section 41 takes the process management data M3 into consideration when grouping the electronic components inside the mounting data M1. For example, in a case in which the plurality of suction nozzles 27 hold different types of electronic component in the suction process (S31), the data optimization section 41 groups the electronic components into types for which the super-resolution processing is necessary, and types for which the super-resolution processing is unnecessary to perform the optimization.

According to the mounting data M1 which is optimized in this manner, in the suction process (S31), a mixture of types of electronic component for which the super-resolution processing is necessary and types of electronic component for which the super-resolution processing is unnecessary being held together is suppressed. Accordingly, in the state recognition process (S32), since the number of times that the processes relating to the imaging (S43 to S45) are repeated is reduced, the takt time is further shortened. In a case in which the process management data M3 sets the processing level, the data optimization section 41 may perform optimization of the mounting data M1 based on the processing level. Accordingly, the efficiency of the mounting process is further improved.

(Production Facility and Image Processing Device 50)

In the mode of the embodiment, "the production facility" is exemplified as the component mounting machine 10, and "the target object" is exemplified as the electronic component. In relation to this, in addition to the component mounting machine 10, the image processing device 50 may use a board production device other than the component mounting machine 10, an inspection device, or the like as "the production facility" described above.

For example, in a case in which the production facility is a print inspection device, the target object is solder which is printed onto the board by a screen printer. Accordingly, it becomes possible to ensure that the super-resolution processing is only performed on the portions which have a fine print state. In a case in which the production facility is an external appearance inspection device, the target object is a portion of the board corresponding to a zoned testing region. Accordingly, it becomes possible to perform setting such that the super-resolution processing is performed only on portions in which small components are mounted or portions in which electronic components are grouped closely.

The process determination section 51, the super-resolution processing section 52, and the state recognition section 53 of the image processing device 50 are provided in the component mounting machine 10. The part data generation section 32, the suitability determination section 55, and the process management data generation section 56 of the image processing device 50 are provided on the camera stand 3. In comparison, any of the parts of the image processing device 50 may be configured to be provided in the component mounting machine 10. In other words, the part data M2 and the process management data M3 are generated in the component mounting machine 10. Even in this configuration, the same effects are achieved as in the embodiment.

REFERENCE SIGNS LIST

1: board production system, 2: production line, 3: camera stand (production facility), 5: board conveyance device, 10: component mounting machine (production facility), 11: base, 12: component supply device, 13: component transfer device, 14: component camera, 15: board camera, 16: control device, 21: feeder, 25: head driving mechanism, 26: mounting head, 27: suction nozzle, 29: memory section, 31: general-purpose camera, 32: part data generation section, 40: host computer, 41: data optimization section, 42: storage device, 50: image processing device, Dp: mounting machine-side processing section, 51: process determination section, 52: super-resolution processing section, 53: state recognition section, Ds: auxiliary device-side processing section, 55: suitability determination section, 56: process management data generation section, M1: mounting data, M2: part data, M3: process management data, Bd: board, T: electronic component (target object), Ps: supply position.

The invention claimed is:

1. An image processing device, comprising:
circuitry configured to, for each target object of a plurality of target objects:
  acquire image data obtained by imaging the target object at imaging positions at a plurality of locations different from each other by a camera of an auxiliary device external to a component mounting machine adapted to control mounting of the plurality of target objects, each of the target objects being one of a plurality of electronic components to be mounted onto a board using the component mounting machine;
  perform low-resolution processing using low resolution data from the image data acquired at only one of the imaging positions;
  perform high-resolution processing using high resolution data obtained by super-resolution processing from the image data acquired at all of the imaging positions;
  generate part data of the target object using the high resolution data;
  recognize a position of the target object in the low resolution data based on the low-resolution processing;
  recognize the position of the target object in the high resolution data based on the high-resolution processing;
  compare the position of the target object in the high resolution data and the position of the target object in the low resolution data; and
  set, as process management data for each type of the target object, an execution of the super-resolution processing as necessary for future processing, by the component mounting machine, of objects of the type of the target object when the position of the target object in the low resolution data falls outside a range of an allowable error in relation to the position of the target object in the high resolution data, otherwise set the execution of the super-resolution processing as unnecessary for future processing, by the component mounting machine, of objects of the type of the target object when the position of the target object in the low resolution falls within the range of the allowable error in relation to the position of the target object in the high resolution data.

2. The image processing device according to claim 1, wherein the circuitry is further configured to:
  determine whether a resolution of image data of a production object is suitable for determining a state of the production object based on a type of the production object and the process management data;
  execute the super-resolution processing of generating high-resolution data from the image data of the production product when it is determined that the resolution of the image data of the production object is not suitable for determining the state of the production object, otherwise do not execute the super-resolution processing when it is determined that the resolution of the image data of the production object is suitable for determining the state of the production object; and
  determine the state of the object by selective use of the high-resolution data of the production object based on the determination as to whether resolution of the image data of the production object is suitable or not for determining the state of the production object.

3. The image processing device according to claim 2, wherein
the circuitry is further configured to generate the part data including an external shape of the electronic component based on imaging of the electronic component.

4. The image processing device according to claim 2, wherein
a processing level indicating a degree of the super-resolution processing is set for the target object in the process management data, and
the circuitry is further configured to:
acquire the processing level corresponding to the type of the production object from the process management data during the execution of the super-resolution processing of the image data of the production product, and
generate the high resolution data of the image data of the production product which satisfies the processing level through the super-resolution processing.

5. The image processing device according to claim 4, wherein the processing level is defined using a number of the imaging positions which are used in the super-resolution processing.

6. The image processing device according to claim 2, wherein
the image processing device is applied to a production facility,
the production facility is the component mounting machine which mounts the electronic components onto the board, and
the production object is one of a plurality of electronic components which is held by a holding device of the component mounting machine.

7. A board production system, comprising:
the image processing device according to claim 6; and
circuitry configured to optimize mounting data, in which a mounting order of the electronic components is determined based on coordinates on the board onto which the electronic components are to be mounted and the determination result of whether the resolution of the image data of the production object is suitable for determining the state of the production object.

8. The image processing device according to claim 2, wherein
the circuitry is further configured to switch execution of super-resolution processing to low-resolution processing when is determined that the resolution of the image data of the production object is suitable for determining the state of the production object.

\* \* \* \* \*